(12) United States Patent
D'Angelo et al.

(10) Patent No.: US 7,728,538 B2
(45) Date of Patent: Jun. 1, 2010

(54) METHOD AND RELATED DEVICE FOR ESTIMATING THE CURRENTS FLOWING IN WINDINGS OF A POLY-PHASE ELECTRICAL LOAD AT A CERTAIN INSTANT

(75) Inventors: Giuseppe D'Angelo, Casalnuovo di Napoli (IT); Giovanni Moselli, Sant' Arpino (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 330 days.

(21) Appl. No.: 12/015,231

(22) Filed: Jan. 16, 2008

(65) Prior Publication Data
US 2008/0180095 A1 Jul. 31, 2008

(30) Foreign Application Priority Data
Jan. 17, 2007 (IT) .......................... VA2007A0008

(51) Int. Cl.
*H02P 21/14* (2006.01)
*G05B 11/28* (2006.01)
(52) U.S. Cl. .................. 318/400.02; 318/599; 318/801; 363/40; 363/78; 702/64
(58) Field of Classification Search ......... 318/432–434, 318/599, 800, 801, 811, 400.02, 400.13; 73/114.23; 324/521, 522, 713, 177, 76.39, 324/76.77; 702/64; 363/40, 78, 74
See application file for complete search history.

(56) References Cited

U.S. PATENT DOCUMENTS 5,309,349 A * 5/1994 Kwan .......................... 363/98
5,959,431 A * 9/1999 Xiang ......................... 318/811
6,653,812 B1 * 11/2003 Huo et al. .................... 318/801
6,984,953 B2 * 1/2006 Quirion et al. ........... 318/400.3
7,049,778 B2 * 5/2006 Katanaya ............... 318/400.04
7,075,267 B1 * 7/2006 Cheng ......................... 318/807

(Continued)

OTHER PUBLICATIONS

Frede Blaabjerg, et al., "Single Current Sensor Technique in the DC Link of Three-Phase PWM-VS Inverters: A Review and a Novel Solution," Sep. 1, 1997, vol. 33, No. 5, pp. 1241-1253.

*Primary Examiner*—Walter Benson
*Assistant Examiner*—Eduardo Colon-Santana
(74) *Attorney, Agent, or Firm*—Lisa K. Jorgenson; Allen, Dyer, Doppelt, Milbrath & Gilchrist, P.A.

(57) ABSTRACT

There is a method of estimating values of winding currents, at an instant of a period, in a winding of a load, controlled in space vector modulation mode through symmetrical control phases. The winding is cyclically coupled between two supply lines through respective switches. A measuring device is alternately coupled to the supply lines. A current of one supply line, with anticipation smaller than or equal to half of the period with respect to the instant and chosen so the current is equal in amplitude to the winding current, and a current of the supply line with delay equal to the anticipation with respect to the instant, is measured. The winding current is estimated at the instant based upon the supply line currents. A threshold interval is fixed between consecutive switching edges of control phases of the winding and another control phase of the switching period wherein current is measured.

14 Claims, 11 Drawing Sheets

U.S. PATENT DOCUMENTS

| | | | |
|---|---|---|---|
| 7,102,327 B2 * | 9/2006 | Ho | 318/812 |
| 7,190,599 B2 * | 3/2007 | Virolainen et al. | 363/98 |
| 7,545,110 B2 * | 6/2009 | Williams et al. | 318/254.1 |
| 7,612,522 B2 * | 11/2009 | Williams et al. | 318/819 |
| 2003/0173946 A1 * | 9/2003 | Liu et al. | 324/107 |
| 2004/0032357 A1 * | 2/2004 | White | 341/155 |
| 2005/0174076 A1 | 8/2005 | Katanaya | 318/254 |
| 2005/0206341 A1 | 9/2005 | Yin Ho | 318/812 |
| 2008/0180056 A1 * | 7/2008 | Maeda et al. | 318/729 |
| 2008/0225561 A1 * | 9/2008 | Park et al. | 363/95 |
| 2009/0212733 A1 * | 8/2009 | Hsieh et al. | 318/729 |
| 2009/0244937 A1 * | 10/2009 | Liu | 363/46 |
| 2009/0284194 A1 * | 11/2009 | Forte | 318/400.02 |

* cited by examiner

METHOD AND RELATED DEVICE FOR ESTIMATING THE CURRENTS FLOWING IN WINDINGS OF A POLY-PHASE ELECTRICAL LOAD AT A CERTAIN INSTANT

FIELD OF THE INVENTION

This invention relates to SVM control of poly-phase electrical loads and, more particularly, to a method and a related device for estimating the currents flowing at the same instant through different windings of the poly-phase load, using a single current sensor.

BACKGROUND OF THE INVENTION

For illustrating control techniques of poly-phase electrical loads, reference will be made to a star connected three-phase electrical motor in view of its large use in innumerable applications, but the same considerations apply, to any poly-phase electrical load in any configuration. One of the most widely used techniques for the control of three-phase electric motors is the FOC (Field Oriented Control). This technique is based on so-called SVM modulation (Space Vector Modulation), which induces sinusoidal voltages and currents in the windings of the motor and requires an accurate measurement of the rotor position and of the phase currents of the motor.

Figure 1:
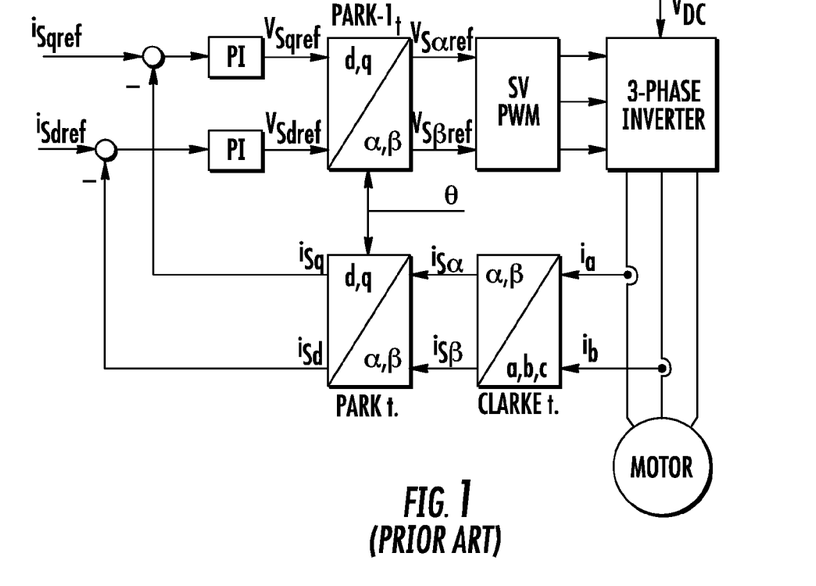
FIG. 1 depicts the FOC control scheme of a three-phase motor in accordance with the prior art.

FIG. 1 depicts a block diagram of a system for controlling the motor torque by the FOC technique. When the windings of the motor are connected in star configuration, it is sufficient to measure only two phase currents for reconstructing the values of all three-phase currents.

When using an inverter for driving the windings of a motor, inevitably voltage harmonics superposed on the main voltage frequency are generated. These drive voltage harmonics produce current harmonics that disturb the measurement of the current in the windings.

In order to prevent or reduce spurious effects due to current harmonics, the currents are measured at certain instants. It has been shown in the article by J. Richardson entitled "Implementation of a PWM Regular Sampling Strategy for AC Drives" that there is no contribution of harmonics superposed on the main component of the current at the beginning (instant 0) and at half (T/2) of the modulation period T. As an alternative, a method that contemplates repeated current measurements during the same period for estimating the values at instants 0 and T/2 as integral average values for the modulation period is known from the article by V. Blasko, et al. entitled "Sampling Methods for Discontinuous Voltage and Current Signals and Their Influence on Bandwidth of Control Loops of Electrical Drives".

Figure 2:
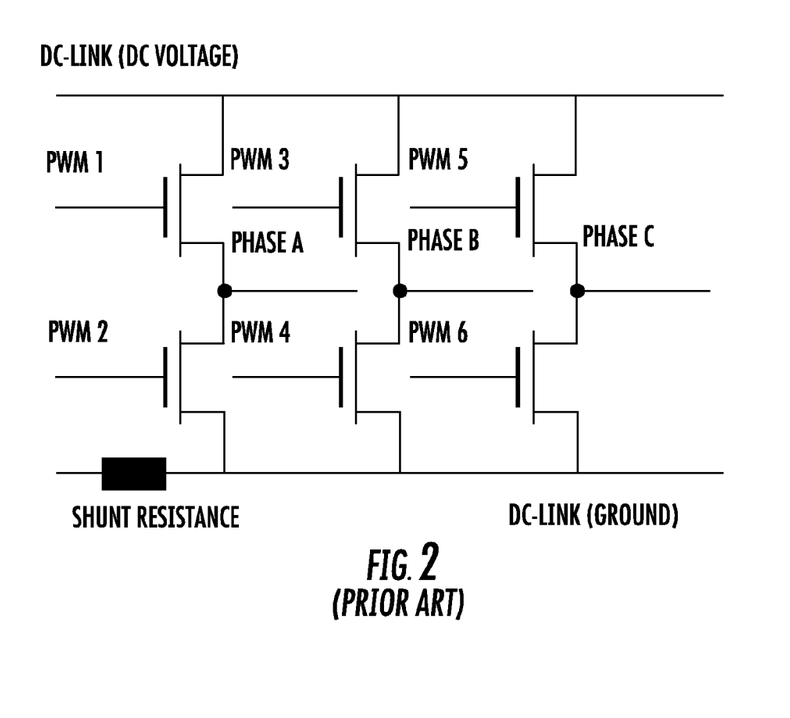
FIG. 2 depicts a three-phase inverter with sensing resistor on the line DC-LINK in accordance with the prior art.

In general, measurement of phase currents for controlling a three-phase electric motor through an inverter contemplates the use of at least two current sensors coupled to the motor windings. Moreover, in order to protect the system from eventual overcurrents and/or overvoltages, another sensor, typically a sensing resistor, is connected on a so-called DC-LINK line, as depicted in FIG. 2. Therefore, a total of three current sensors are generally required.

In order to reduce the number of current sensors and thus overall costs, and to increase efficiency, the sensors connected to the phase windings of the load may not be employed and the current sensor placed on the DC-LINK line be exploited also for measuring the phase currents. Indeed, considering the possible states of a three-phase inverter, it is noticed that, depending on the state of the switches, the current flowing through the DC-LINK line is null or equal in amplitude to one of the phase currents of the motor, as shown in following table.

| Voltage vectors | DC-link |
|---|---|
| 100 | $i_a$ |
| 110 | $-i_c$ |
| 010 | $+i_b$ |
| 011 | $-i_a$ |
| 001 | $+i_c$ |
| 101 | $-i_b$ |
| 000-111 (unused) | 0 |

Figure 3:
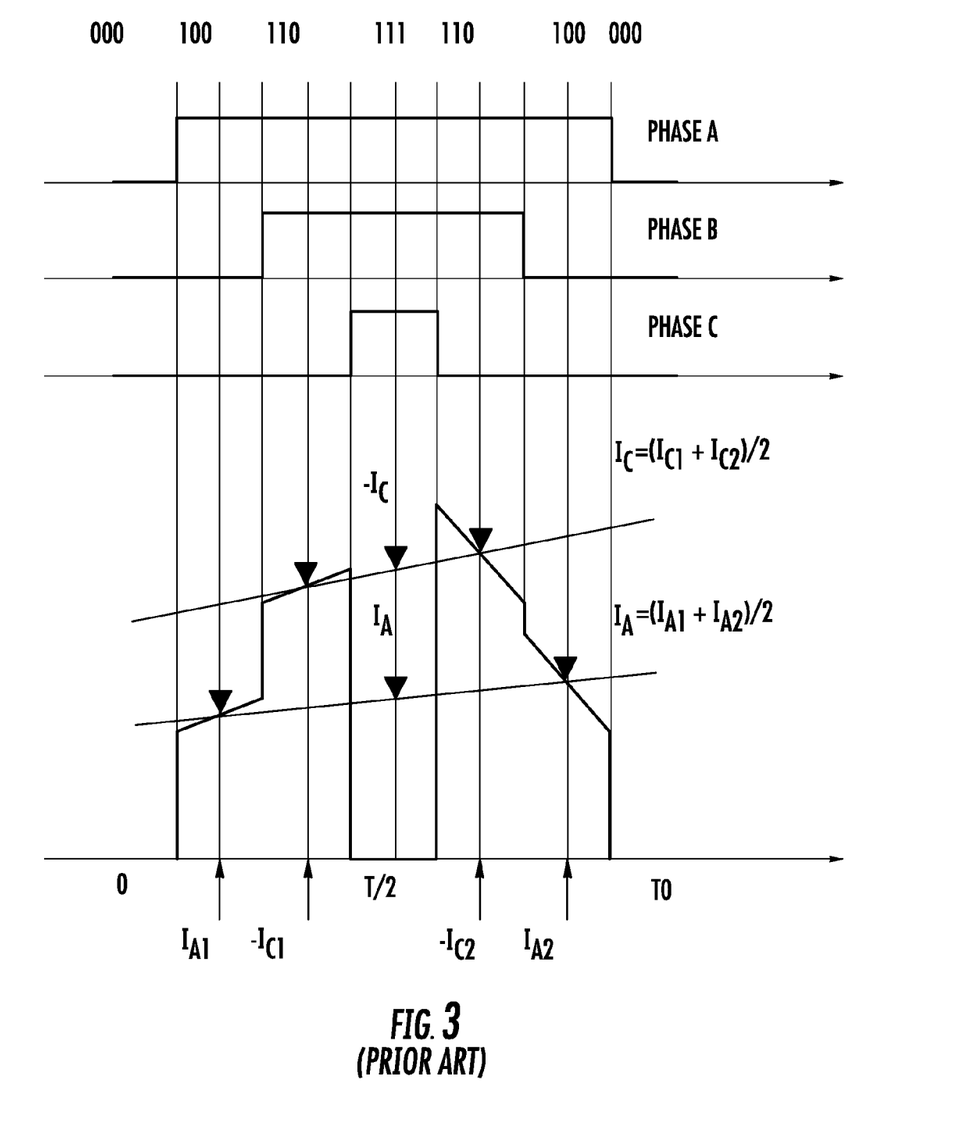
FIG. 3 shows how to measure a phase current by sensing the current flowing through the line DC-LINK of the inverter of FIG. 2 in accordance with the prior art.

By carrying out at most four current measurements per modulation period, it is thus possible to estimate two of the three phase currents of the motor at the instants 0 and T/2 of the modulation period T. For example $-i_c$ and $i_a$ can be calculated for the same instant T/2, as the mean value of $i_{c1}$ and $i_{c2}$ and of $i_{a1}$ and $i_{a2}$, respectively, as shown in FIG. 3. The figure shows a modulation pattern, waveforms of the current flowing through the line DC-LINK, and the instants at which the current measurements are carried out.

As stated above, in order to reduce as much as possible contributions due to harmonics (caused by the inverter), the currents should be measured at the instants 0 and T/2 of the modulation period T. By exploiting the symmetry of the modulation pattern, it is possible to obtain the value of currents at the instant T/2 as the mean value of the two current measurements mode at the instants 0. This estimation is substantially free of inaccuracies due to harmonics.

Figure 4A:
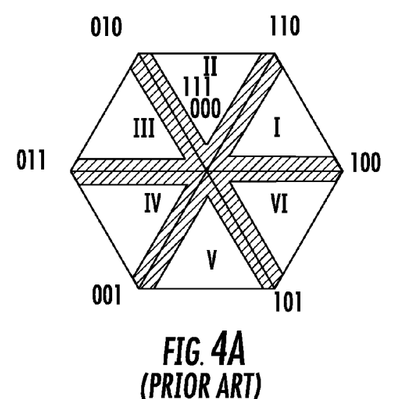
Figure 4B:
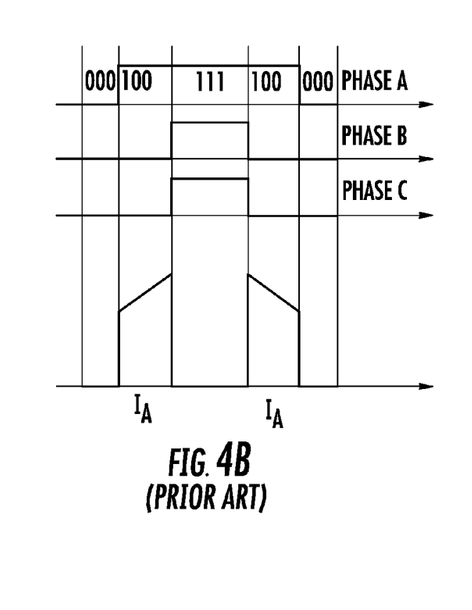

Nevertheless, this technique is burdened by problems due to the modulation pattern. When the voltage vector to be applied to the phase windings of the motor is near the border between two possible sectors of the pattern (dashed zone in FIG. 4(*a*)), only one current can be measured correctly, but not the other. Indeed, the available time window within which the measurement can be done is so short that it does not allow a correct measurement by an A/D converter as commonly employed. In particular, by neglecting the ringing phenomena due to state transitions of the inverter, the time window should last at least the sampling time of the converter.

Figure 4C:
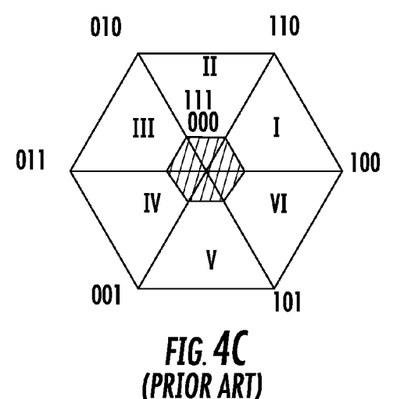
Figure 4D:
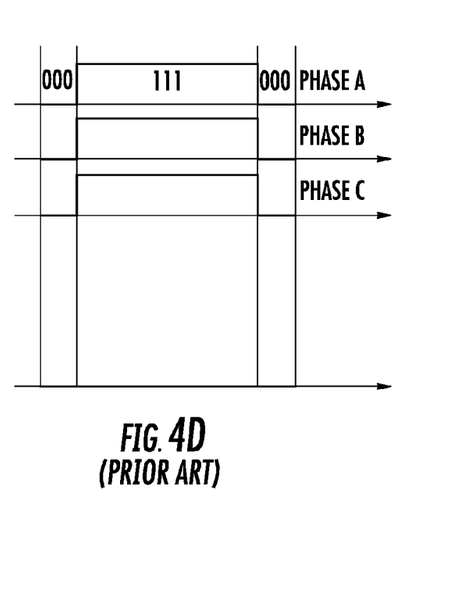

Moreover, if a single A/D converter is used, the time interval between the beginning of two useful measurement windows should be at least longer than or equal to the conversion time. A similar problem arises in conditions of small modulation indices (FIGS. 4 (*c*) and (*d*)): in these cases it is impossible to measure any of the phase currents of the motor.

Figure 5A:
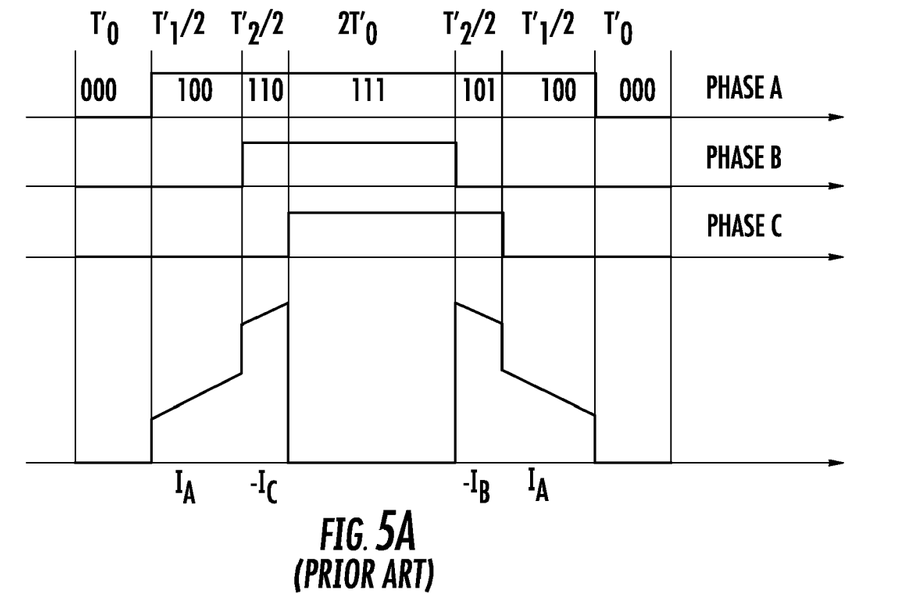
FIGS. 5a and 5b illustrate an example of vector driving scheme and the respective waveforms obtained with a first known control method in accordance with the prior art.
Figure 5B:
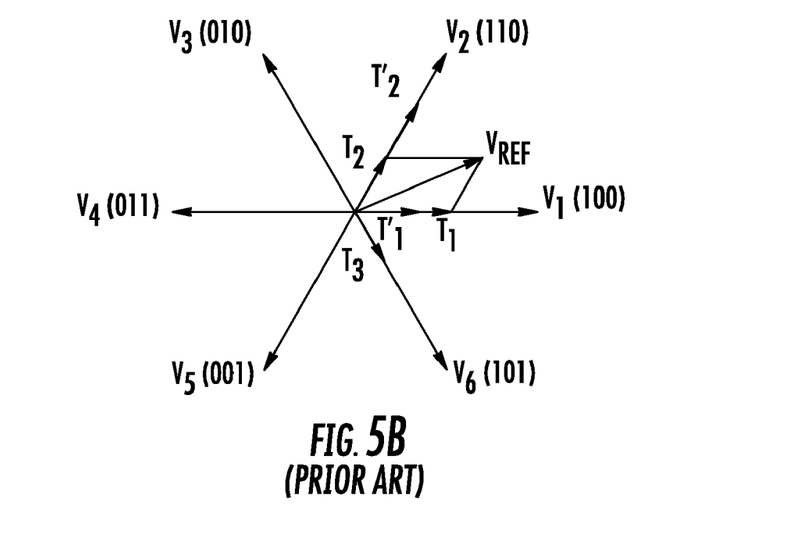
Figure 6A:
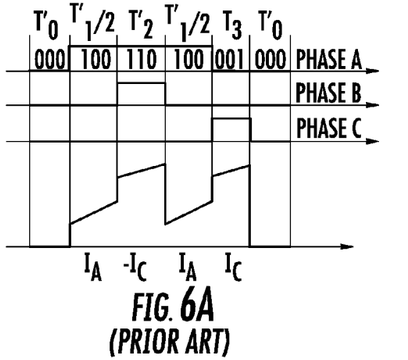
FIGS. 6a to 6d illustrate an example of vector driving scheme and the respective waveforms obtained with a second known control method in accordance with the prior art.
Figure 6B:
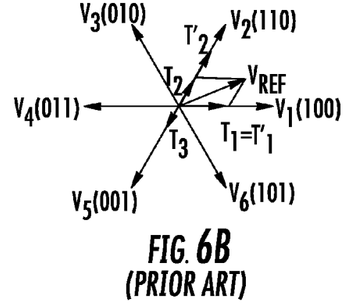
Figure 6C:
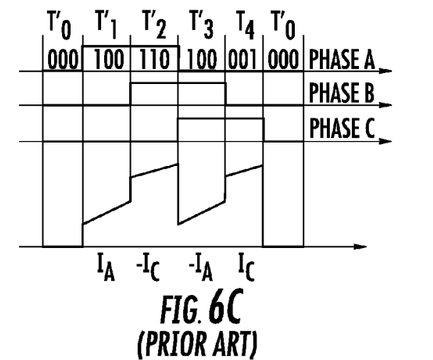
Figure 6D:
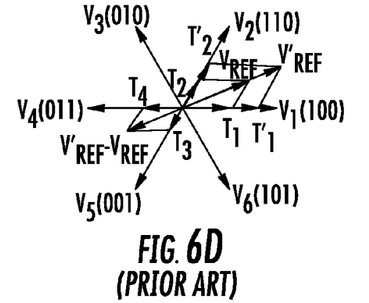

In order to overcome the above problems, two methods are known from the article by Woo-Cheol Lee et al. entitled, "Comparison of Single-Sensor Current Control in the DC Link for Three-Phase Voltage-Source PWM Converters". The functioning principle on which they are based is the same, but they work differently. The first method, illustrated in FIG. 5, contemplates an arrangement of the voltage vector components that substantially determines a time shift of the active intervals of the involved PWM signals. This method keeps the time duration of the active interval for each PWM signal (this is a necessary condition for not altering the driving of the motor) and does not increase the number of switchings and thus leaves unchanged the conduction losses.

However the modulation pattern is no longer symmetrical, thus the total harmonic distortion (THD) of the phase currents of the motor increases. Moreover, it is impossible to carry out symmetric measurements of both currents and to calculate current values at the same instant, thus it is impossible to eliminate the error due to the current harmonics that are inevitably generated by the inverter. Moreover, this method is not applicable for driving the motor with relatively small modulation indices.

The second method, illustrated in FIG. 6, contemplates, as in the previous case, a driving that implies a time shift of the active intervals. This method keeps the time duration of the active state of each PWM signal, but increases the number of switchings when the voltage vector to be applied to the phase windings of the motor is close to the border between two sectors of the modulation pattern, thus increasing the amount of conduction losses. Moreover, in both cases (FIGS. 6 (a) and (c)) two simultaneous switchings take place and this is not desirable because it could prolong transients that follow the switchings, thus increasing the minimum time required for measurements. The modulation pattern is not symmetrical, thus the THD of the phase currents of the motor increases and it is impossible to carry out symmetrical measurements for two phase currents. Therefore, it is impossible to estimate precisely the value of two currents at the same instant and thus the error due to current harmonics superposed to the main frequency cannot be eliminated.

Indeed, it could be possible to calculate $-i_c$ and $i_a$ at the same instant T/2, no longer as the mean value of $i_{c1}$ and $i_{c2}$ and of $i_{a1}$ and $i_{a2}$-$i_c$, respectively, but as a weighted time average. However, this procedure significantly increases the computational load because it is not sufficient to halve the sum of the values (that may be executed with a fast bit-shift operation using a very simple hardware), but it implies a division that requires a more complex hardware, and weight coefficients to be used in the time averaging operation by carrying out multiplications of coefficients and measured values.

SUMMARY OF THE INVENTION

A method of estimating the current flowing through a winding of a poly-phase electric load at a certain instant, while keeping constant the duty-cycle of the PWM driving signals, and without increasing relevantly the THD, has now been found.

This result is obtained by imposing at least a certain minimum time between two consecutive edges of the control phases, sufficient for measuring the current flowing through a DC-LINK line, but keeping symmetrical all control phases in respect to the instant of the cycle at which the current is to be determined.

According to a method of this invention, it is checked whether or not, in the switching cycle during which the current measurement is to be made, the edges of the control phases are sufficiently spaced one from the other. If not, switchings are purposely generated such that the control phases are always symmetrical in respect to the instant 0 or T/2, but with edges spaced one from the other by a certain minimum time.

For not increasing excessively switching losses, it is preferable to modify the interval in which a control phase is in the active state and subtract an area thereby subtended, to keep the duty-cycle constant.

The method may be implemented through a software run on a computer or microprocessor. Alternatively and preferably, the method is hardware implemented in a specially designed device.

BRIEF DESCRIPTION OF THE DRAWINGS

FIGS. from 4a to 4d depict two vector driving schemes and the waveforms of the respective driving signals in accordance with the prior art.

DETAILED DESCRIPTION OF THE PREFERRED EMBODIMENTS

According to a method of this invention, the switching pattern is modified, if necessary, in a way to allow, in any case, the correct measurement of at least two phase currents through the same sensing resistor connected to a DC-LINK line, thus overcoming the problems of the known methods discussed above.

Figure 7A:
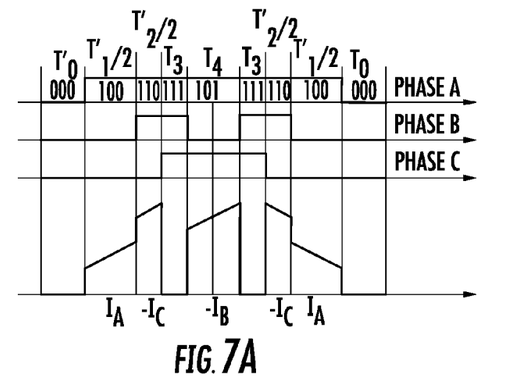
FIGS. 7a and 7b illustrate an example of vector driving scheme and the respective waveforms according to a method of the invention.
Figure 7B:
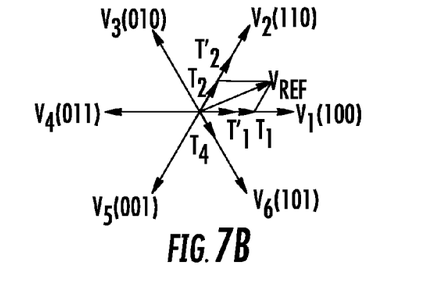

The functioning principle of the method is illustrated in FIG. 7. A method of this invention contemplates an organization of the components of the voltage vector to be applied to the phase windings of the motor that, differently from the prior art methods, does not imply a time shift of the conduction phases of the PWM signals, but significantly modifies the switching pattern for keeping the duration of the active state of each PWM drive signal unchanged and keeping the symmetry of the switching pattern. This permits not increasing the THD of the phase currents of the motor, and, a symmetrical measurement of both currents in a simple and fast manner, eliminating the error due to current harmonic superposition on the main PWM frequency.

Differently from the prior method disclosed in the article by Woo-Cheol Lee et al. entitled, "Comparison of Single-Sensor Current Control in the DC Link for Three-Phase Voltage-Source PWM Converters", the proposed method is applicable even for small modulation indices because it involves two control phases instead of one. At the cost of increasing the number of switchings per period, and thus increasing conduction power losses, simultaneous switchings advantageously never take place because the switching edges are spaced by an interval of pre-established duration.

The method may be implemented in a dedicated device, the block diagram of which will be illustrated, or alternatively via software by the use of a microprocessor, for example of the family ST10F2xx.

Figure 8:
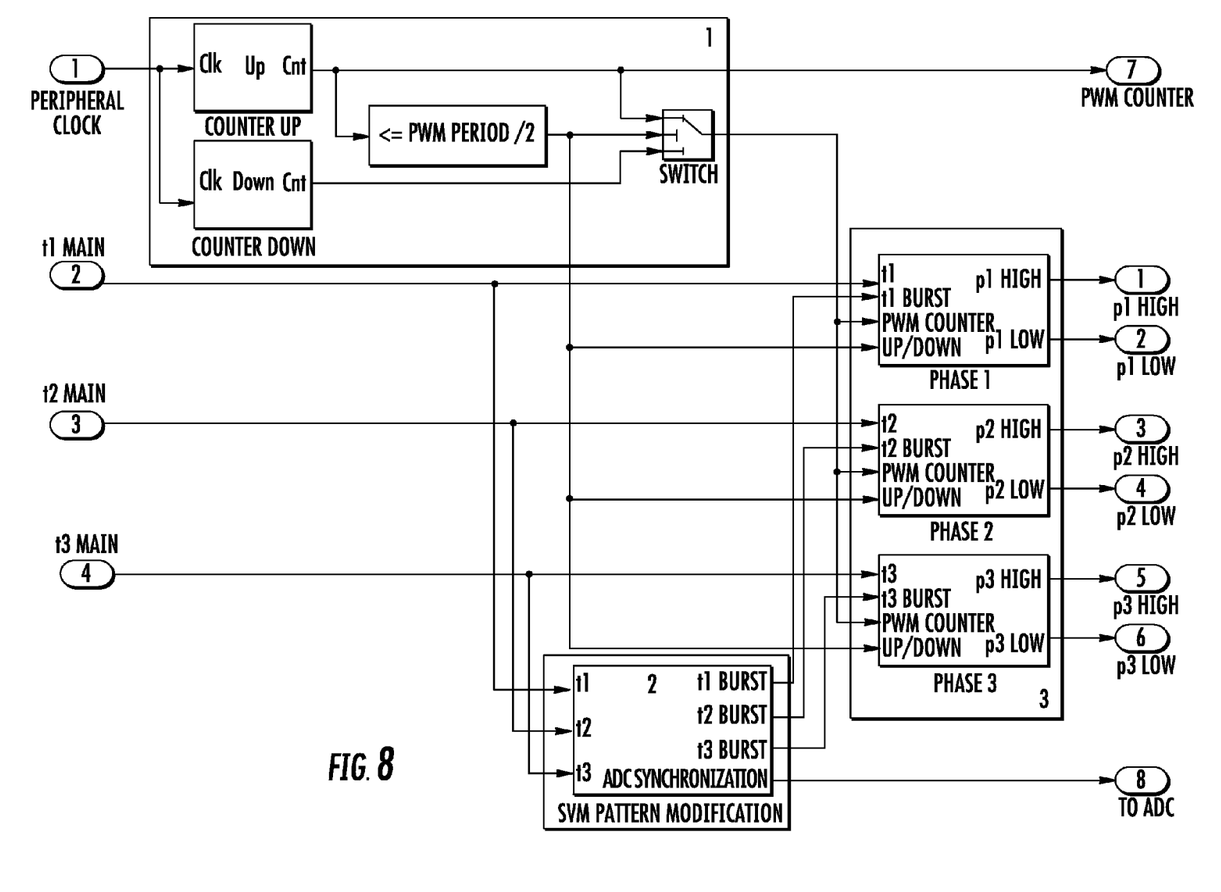
FIG. 8 depicts a general scheme of a device that implements a method of the invention.

A block diagram of a device for a hardware implementation of this invention is depicted in FIG. 8 and comprises sub-blocks 1, 2 and 3. Circuit 1, using two counters "Counter up" and "Counter down" to form a double-ramp counter, generates the typical double ramp used in switching patterns of the so-called "center aligned" type. This triangular signal is available on the output of the block Switch. Circuit 3 comprises the blocks PHASEi, with i=1, 2, 3.

Figure 9:
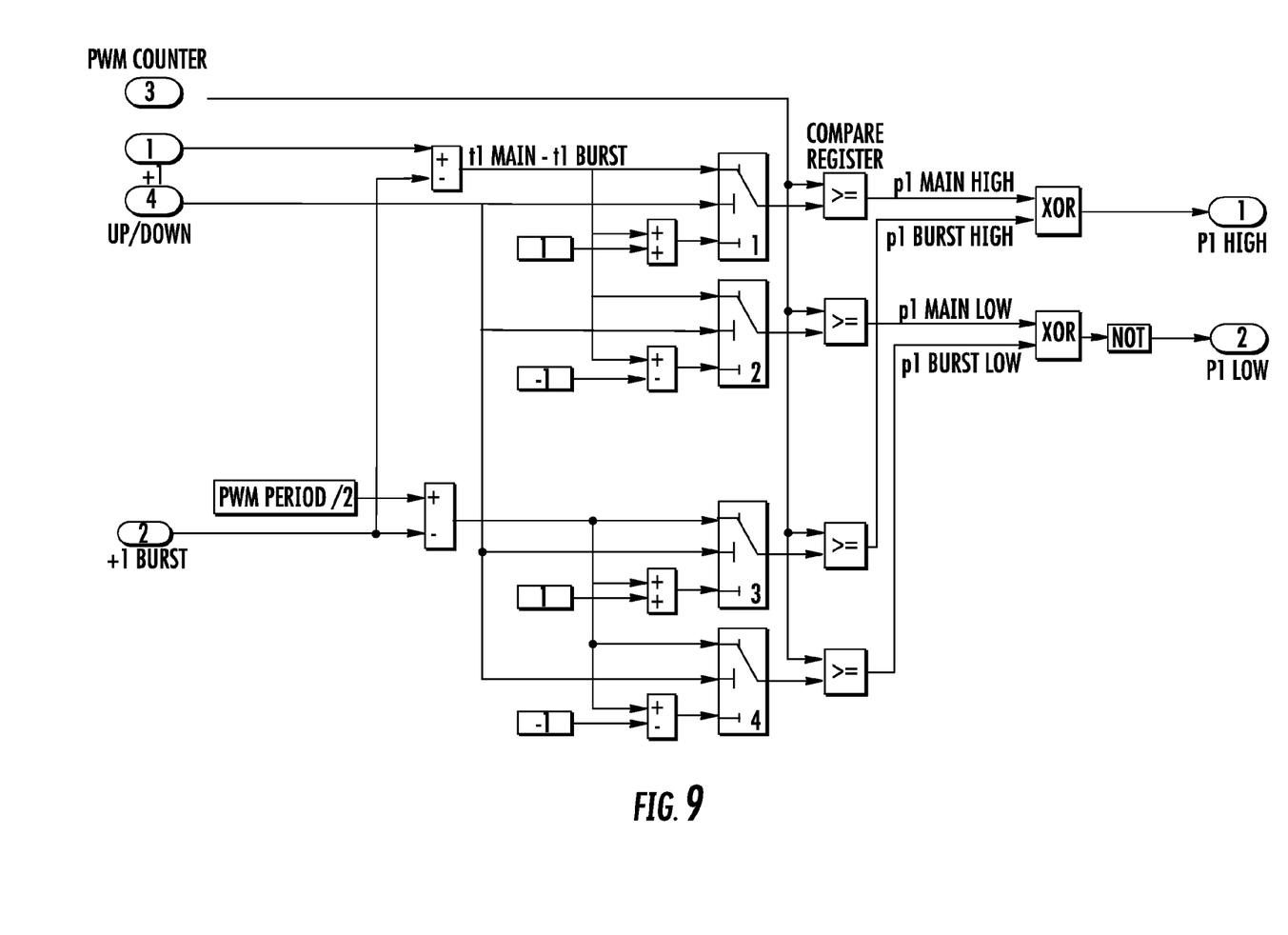
FIG. 9 depicts an embodiment of the blocks PHASEi of FIG. 8.

FIG. 9 shows in greater detail the block PHASE1, the blocks PHASE2 and PHASE3 being structurally identical to the block PHASE1. The block PHASE1 outputs the logic driving signals P1 HIGH and P1 LOW of the inverter, relatively, to the control phase 1 of the motor. The two signals P1 HIGH and P1 LOW are complementary to each other and drive the high side switch and the low side switch of the inverter during phase 1.

Figure 10:
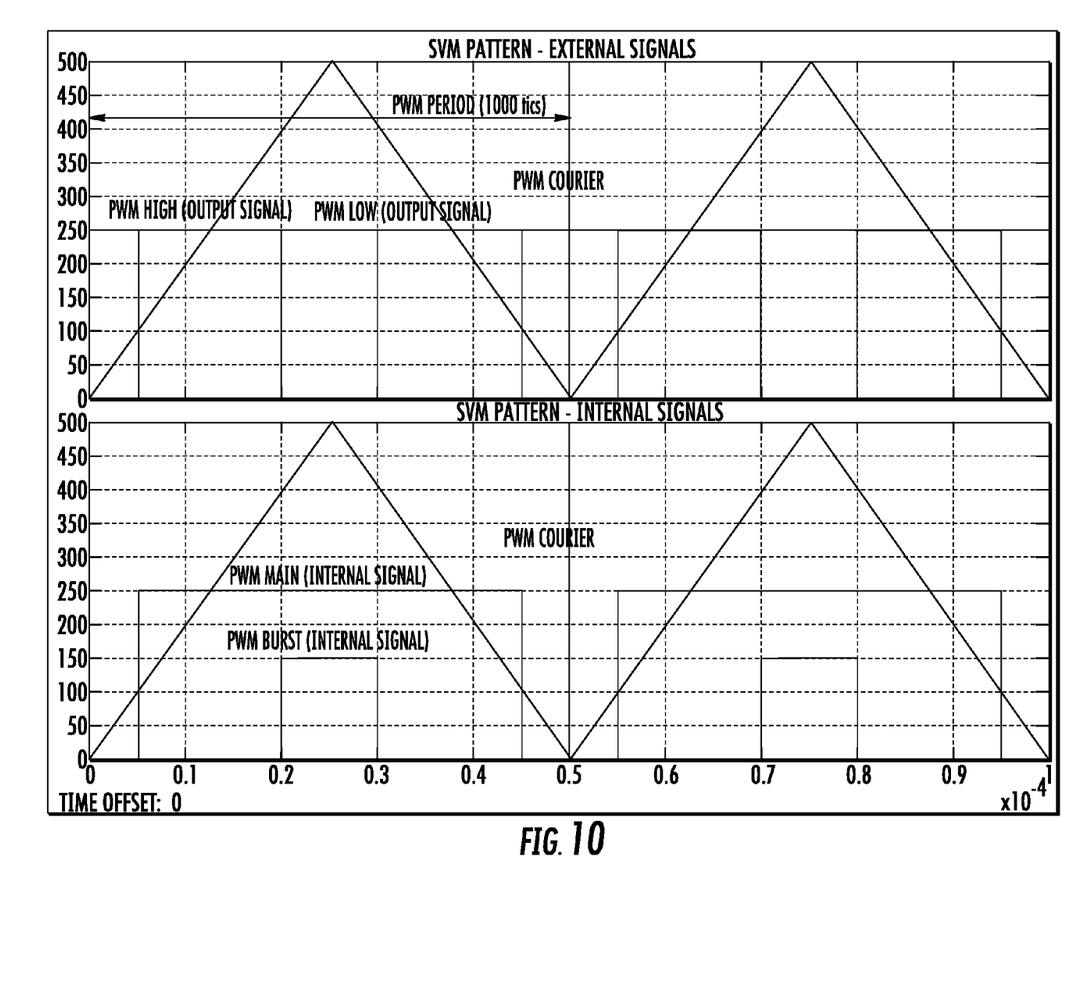
FIG. 10 depicts waveforms obtained through a simulation of the functioning of a device of the invention.

Switches 1, 2, 3 and 4 make symmetrical the turn on and turn off instants of the logic signals P1 HIGH and P1 LOW with respect to the waveform in the modulation period of the output of circuit 1 (output of the double-ramp counter). These logic signals are obtained as a logic XOR of the logic signals P1 MAIN HIGH and P1 BURST HIGH and of the logic signals P1 MAIN LOW and P1 BURST LOW. For example, the value T1 MAIN−T1 BURST, used by the related comparison register for generating the logic signal P1 MAIN HIGH, is summed to 1 if the output of the up-down counter is decreasing. The other intermediate signals P1 MAIN LOW, P1 BURST HIGH and P1 BURST LOW are generated in a similar way. FIG. 10 shows a modified switching pattern together with the corresponding waveforms of circuit signals.

The function of the block Circuit 2 is establishing when it is necessary to modify the pattern, and also fixes the amount of correction, that is, it generates the values of the burst signals for each phase of the motor. The timing signals generated by the control algorithm, T1__MAIN, T2__MAIN and T3__MAIN, are input to the circuit 2 that modifies the SVM pattern (SWM PATTERN MODIFICATION). This functional block evaluates the time window useful for current measurement, once the sampling times and the conversion times of the A/D converter are known. This data is not input to the circuit because it is constant once the specifications of the A/D converter used for converting in digital form the voltage drop on the sensing resistors inserted in the line DC-LINK are known. Should the useful time window for measurement be insufficient, the above functional block determines the modification of the modulation pattern by assigning appropriate values to the burst signals T1__BURST, T2__BURST, T3__BURST.

Figure 11:
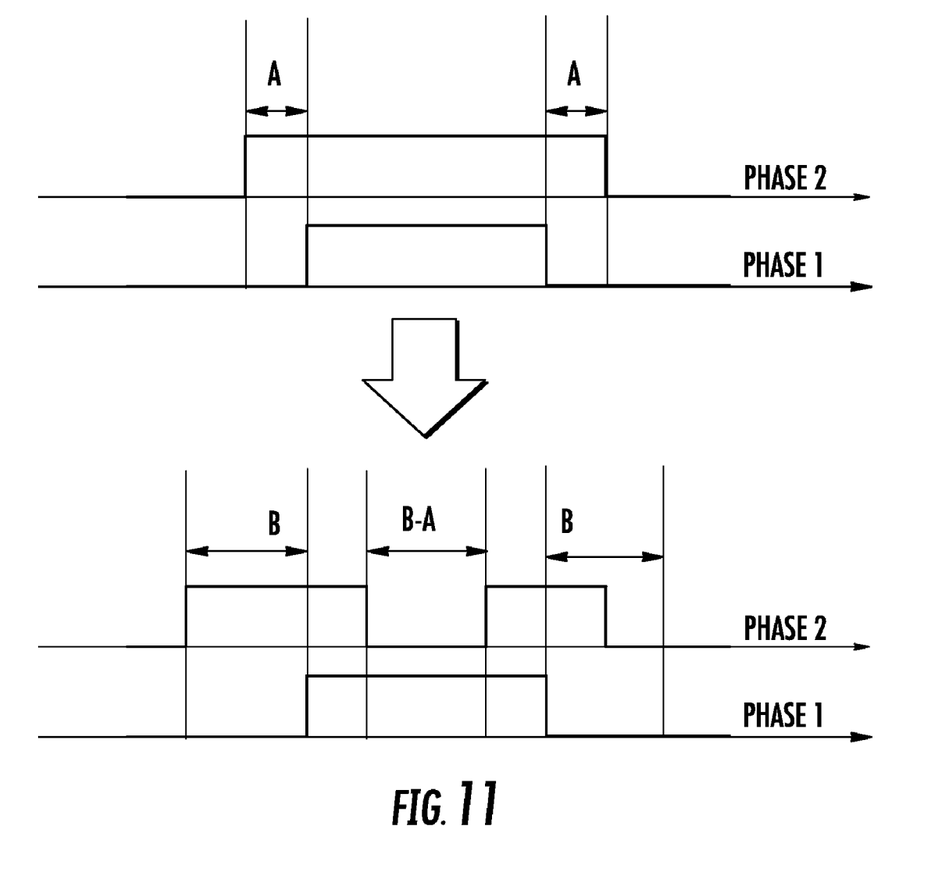
FIG. 11 illustrates how a device of the invention acts by modifying the driving phase of the electric load for spacing the switching edges of two phases.

In order to better clarify the relations among the burst signals and the useful time windows for measurements, consider, for example, the phases 1 and 2 and suppose that the duration of the time window useful for carrying out the measurement relative to these two phases is A. B is the minimum duration, and if A<B and t1>t2, the signal T1 BURST will be 0 (unchanged) because the time duration of the logic signal on the phase 1 is the minimum between the two, and T2 BURST will assume at least the value (B−A) such that the modified time window will have a duration larger than or equal to B, as depicted in FIG. 11.

It should be noticed that, in general, the control algorithm outputs the turn off times, and not the turn on times, of the logic driving signals of the inverter. However, the above algorithm may be implemented even for the turn on times, though the hardware structure (i.e. the architecture of circuit 3) may be adapted.

The timing signals produced by the control algorithm and the burst times generated by circuit 2 (SVM PATTERN MODIFICATION), even if null, are input to circuit 3 and in particular to the blocks PHASE1, PHASE2 and PHASE3 that, as described above, generate the logic driving signals of the inverter Pi HIGH and Pi LOW, being i=1, 2, 3.

Figure 12:
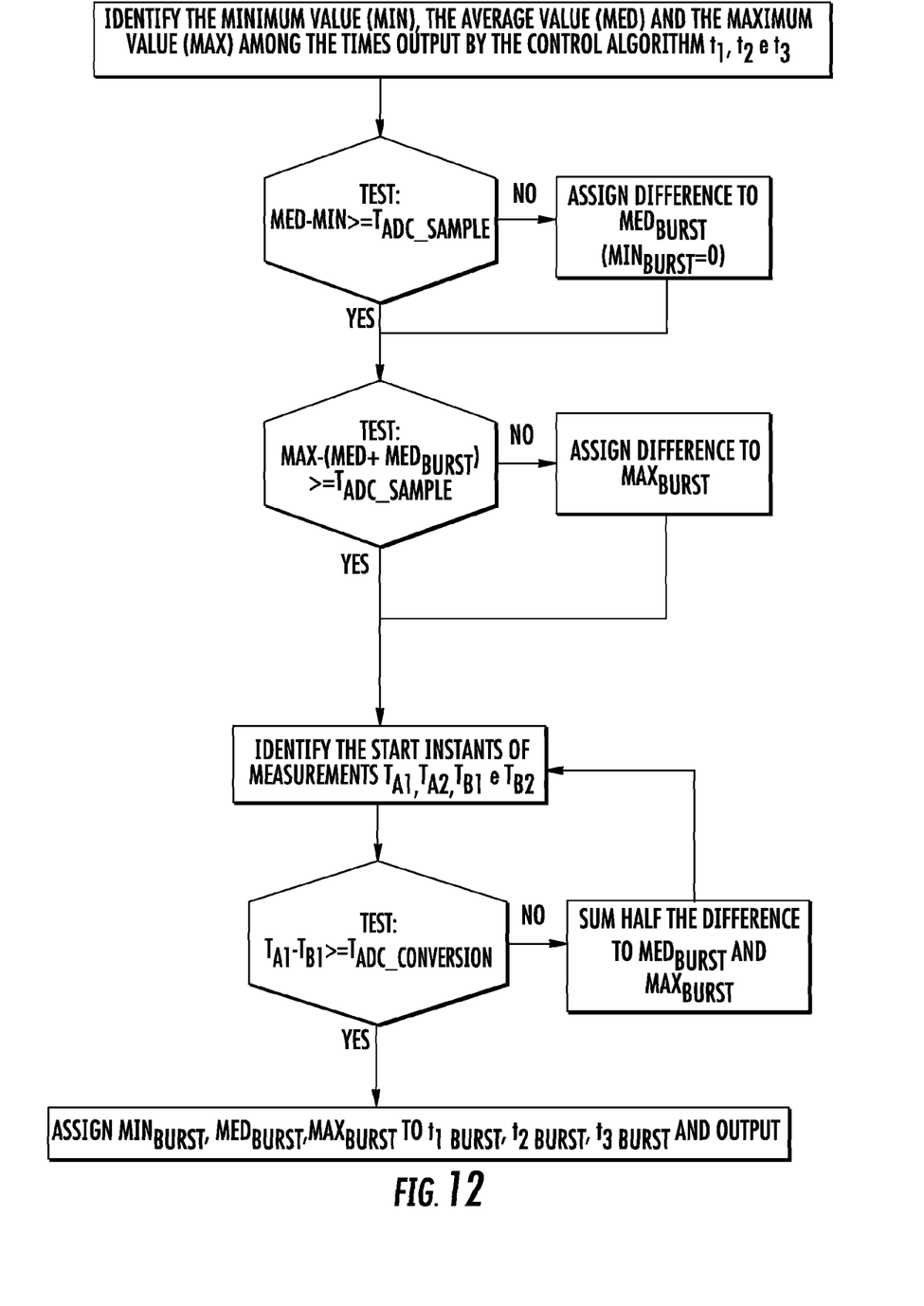
FIG. 12 is a flow chart that illustrates a method of this invention.
Figure 13:
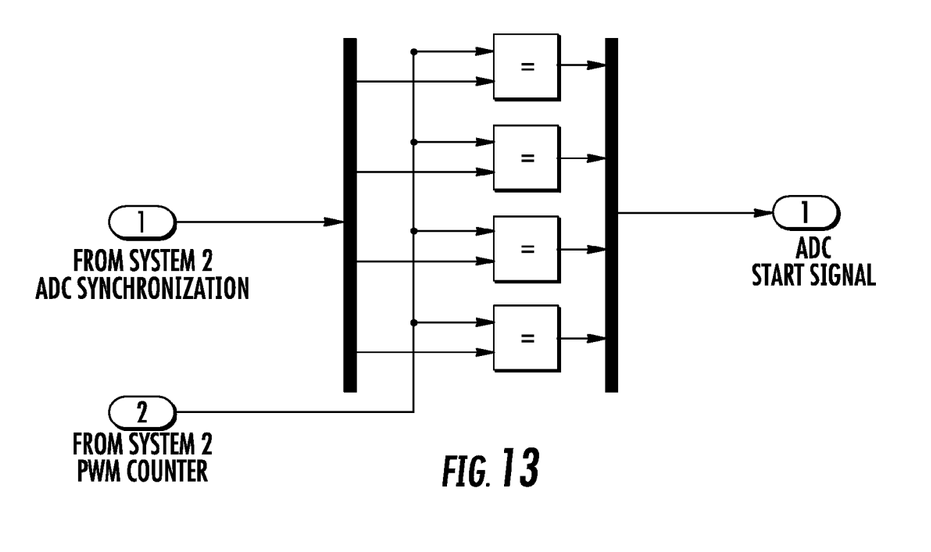
FIG. 13 illustrates a logic circuitry that synchronizes the start of each measurement.

FIG. 12 is a flow chart that illustrates how the switching pattern is modified according to a method of this invention. The start instants of each of the four current measurements (that in general vary for each switching period) are established to impose a certain offset. These timing data may be supplied to a logic circuitry that synchronizes the start of each measurement using a double-ramp counter, that is a timer, of the PWM peripheral such to carry out automatically the measurements, as illustrated in FIG. 13.

That which is claimed:

1. A method of estimating values of a winding current flowing, at an instant of a period, in at least one winding of a poly-phase electric load, controlled in a space vector modulation (SVM) mode through control phases symmetrical with respect to the instant, the at least one winding being cyclically coupled between a first supply line and a second supply line through respective switches, using a same measuring device alternately coupled to one of the first supply line and the second supply line, the method comprising:

measuring an anticipated supply line current, flowing through one of the first supply line and the second supply line, with an anticipation smaller than or equal to a half of the period with respect to the instant and chosen such that the supply line current is equal in amplitude to the winding current;

measuring a delayed supply line current, flowing through one of the first supply line and the second supply line, with a delay equal to the anticipation with respect to the instant;

estimating a value of the winding current at the instant based upon the anticipated supply line current and the delayed supply line current; and     fixing a threshold interval between two consecutive switching edges of a control phase of the at least one winding and another control phase of the switching period in which current measurements are to be carried out.

2. The method of claim 1, wherein the value of the winding current at the instant is estimated based upon an arithmetic mean of the anticipated supply line current and the delayed supply line current.

3. The method of claim 1, wherein fixing the threshold interval comprises modifying a duration of an active state of one of two control phases by keeping the one of two control phases symmetrical with respect to the instant and keeping a respective duty-cycle constant.

4. The method of claim 3, wherein the duty-cycle is kept constant by subtracting an area subtended by the one of two control phases for compensating an increase of the duration of the active state of the one of two control phases.

5. A computer-readable medium for estimating values of a winding current flowing, at an instant of a period, in at least one winding of a poly-phase electric load, controlled in a space vector modulation (SVM) mode through control phases symmetrical with respect to the instant, the at least one winding being cyclically coupled between a first supply line at a positive supply voltage and a second supply line at a negative supply voltage through respective switches, using a single measurement instrument coupled to one of the first supply line and the second supply line, the computer-readable medium comprising:

a first computer executable module for measuring an anticipated supply line current, flowing through one of the first supply line and the second supply line, with an anticipation smaller than or equal to a half of the period with respect to the instant and chosen such that the supply line current is equal in amplitude to the winding current;

a second computer executable module for measuring a delayed supply line current, flowing through one of the first supply line and the second supply line, with a delay equal to the anticipation with respect to the instant;

a third computer executable module for estimating a value of the winding current at the instant based upon the anticipated supply line current and the delayed supply line current; and a fourth computer executable module for fixing a threshold interval between two consecutive switching edges of a control phase of the at least one winding and of any other control phase of the switching period in which current measurements are to be carried out.

6. The computer readable medium of claim 5, wherein the value of the winding current at the instant is estimated based upon an arithmetic mean of the anticipated supply line current and the delayed supply line current.

7. The computer readable medium of claim 5, wherein fixing the threshold interval comprises modifying a duration of an active state of one of two control phases by keeping the one of two control phases symmetrical with respect to the instant and keeping a respective duty-cycle constant.

8. The computer readable medium of claim 7, wherein the duty-cycle is kept constant by subtracting an area subtended by the one of two control phases for compensating an increase of the duration of the active state of the one of two control phases.

9. A device generating signals representative of values of a winding current flowing, at an instant of a period, in at least one winding of a polyphase electric load, controlled in a space vector modulation (SVM) mode through control phases symmetrical with respect to the instant, the at least one winding being cyclically coupled between a first supply line and a second supply line through respective switches, using a single measurement instrument coupled to one of the first supply line and the second supply line, the device comprising:

current measurement circuitry to be coupled to one of the first supply line and the second supply line; and a generator for control phases for the at least one winding of the poly-phase electric load, for measuring an anticipated supply line current, flowing through one of the first supply line and the second supply line, with an anticipation smaller than or equal to a half of the period with respect to the instant and chosen such that the supply line current is equal in amplitude to the winding current, measuring a delayed supply line current, flowing through one of the first supply line and the second supply line, with a delay equal to the anticipation with respect to the instant, estimating a value of the winding current at the instant based upon the anticipated supply line current and the delayed supply line current, and fixing a threshold interval between two consecutive switching edges of a control phase of the at least one winding and another control phase of the switching period in which current measurements are to be carried out.

10. The device of claim 9, wherein the value of the winding current at the instant is estimated based upon an arithmetic mean of the anticipated supply line current and the delayed supply line current.

11. The device of claim 9, wherein fixing the threshold interval comprises modifying a duration of an active state of one of two control phases by keeping the one of two control phases symmetrical with respect to the instant and keeping a respective duty-cycle constant.

12. The device of claim 11, wherein the duty-cycle is kept constant by subtracting an area subtended by the one of two control phases for compensating an increase of the duration of the active state of the one of two control phases.

13. The device of claim 9, wherein the generator compares a triangular oscillating signal with a respective threshold.

14. The device of claim 9, wherein the generator comprises a control circuit coupled with said generator and said measurement circuitry for imposing a threshold offset time between two consecutive switching edges.

* * * * *